US005351220A

United States Patent [19]

Noselli

[11] Patent Number: 5,351,220

[45] Date of Patent: Sep. 27, 1994

[54] MOVING-COIL ELECTRODYNAMIC ELECTROACOUSTICAL TRANSDUCER

[75] Inventor: Guido Noselli, Flero, Italy

[73] Assignee: Online S.N.C. Di Noselli G. & C., Fiero, Italy

[21] Appl. No.: 81,624

[22] Filed: Jun. 23, 1993

[51] Int. Cl.[5] .................... H05K 5/00

[52] U.S. Cl. .................... 367/175; 181/148; 181/159; 181/177; 181/185; 181/186; 381/153; 381/156; 381/158; 381/161; 381/192; 381/198

[58] Field of Search .................... 367/175; 181/152, 148, 181/159, 177, 185, 186, 187, 189; 381/153, 156, 158, 161, 162, 192, 194, 198

[56] References Cited

U.S. PATENT DOCUMENTS 5,117,462 5/1992 Bie .................... 381/156

OTHER PUBLICATIONS

*Applied Acoustics*, Olson and Massa, ©1939, pp. 240–243.

*Handbook for Sound Engineers, 2nd Ed.*, Ballou, editor, pp. 544–549.

*Primary Examiner*—J. Woodrow Eldred
*Attorney, Agent, or Firm*—McGlew and Tuttle

[57] ABSTRACT

The present invention involves a moving-coil electrodynamic electroacoustical transducer, comprising a disk made of a hard, nonmagnetic material (12), which is superimposed on the diaphragm (11) and has openings for the output of sound, a power-factor-improvement device/super charger (13) made of a nonmagnetic material which is placed in the concavity of the diaphragm (11) and which has annular, concentric ducts (13') having a conical shape, and a cover (14) made of a nonmagnetic material serving as the lid in both configurations of the transducer, the said cover being applied to the body facing the concavity of the said diaphragm in a direct-radiation transducer, while it is applied to the body facing the convexity of the said magnetic disk (12) in an indirect-radiation transducer.

6 Claims, 2 Drawing Sheets

MOVING-COIL ELECTRODYNAMIC ELECTROACOUSTICAL TRANSDUCER

The present utility model pertains to moving-coil electrodynamic electroacoustical transducers for medium and high frequencies.

According to the prior art, electrodynamic electroacoustical transducers are designed for a direct radiation of sound or for an indirect radiation by means of connection to a horn. Transducers of the type in question, which can be used without distinction for one or the other form of acoustical radiation, do not seem to be currently available.

On the other hand, the primary purpose of the present invention is to provide an electrodynamic electroacoustical transducer capable of being used both with direct radiation and with indirect radiation, by means of connection to a horn, therefore being suitable for a twofold use thanks to a new, original arrangement and combination of the components, of which it is composed, and more specifically thanks to two connection systems of the diaphragm. Moreover, such a twofold use of the transducer does not penalize the acoustical performances of the diaphragm, even though its achievement by means of two different connection systems of the diaphragm to the air implies mechanical insights which may seem contradictory. Actually, the acoustical performances are maintained and ensured suitably by the specific features of the transducer proposed here. In fact, mechanical insights are provided in this embodiment thanks to which the supposed contradiction is overcome, and on the contrary, it is possible to obtain a better control of the acoustical load on the diaphragm, thus an improvement in performances.

According to the invention, a moving coil electrodynamic electroacoustical transducer is provided for medium and high frequencies. The transducer is usable either for direct radiation of sound or for an indirect radiation of sound by means of connection to a horn. The transducer includes a common compound body and a diaphragm connected to the body with a washer interposed between the body and the diaphragm. The diaphragm has a convex part. The disk is provided made of non-magnetic hard material which is superimposed on the diaphragm. The disk adopts the shape of the diaphragm including the convex part. The disk has openings for the output of sound whereby the disk serves as a power-factor-improvement device/super charger. In the configuration of the direct-radiation transducer a power-factor-improvement device/super charger element made of non-magnetic material is arranged in the concavity of the diaphragm between the diaphragm and the compound body. The power-factor-improvement device/super charger device has annular concentric ducts with a conical shape. A cover is provided made of non-magnetic material which serves as a lid in both configurations of the transducer. The cover is applied to the body facing the concavity in a direct-radiation transducer arrangement and the cover is applied to the body facing the convexity of the non-magnetic disk in an indirect radiation transducer. A flange for completing the assembly is provided including either a flange for the configuration of the direct radiation transducer positioned about the convex side of the diaphragm or a flange for the indirect-radiation transducer positioned on the concave side of the diaphragm.

The above mentioned structure has the advantage of incorporating in a single structure the components for obtaining two different use configurations by replacing only one component.

BRIEF DESCRIPTION OF THE DRAWINGS

In any case, greater details of the present invention will become more evident from the description below with reference to the attached drawings, in which.

DETAILED DESCRIPTION OF THE PREFERRED EMBODIMENT

Figure 1:
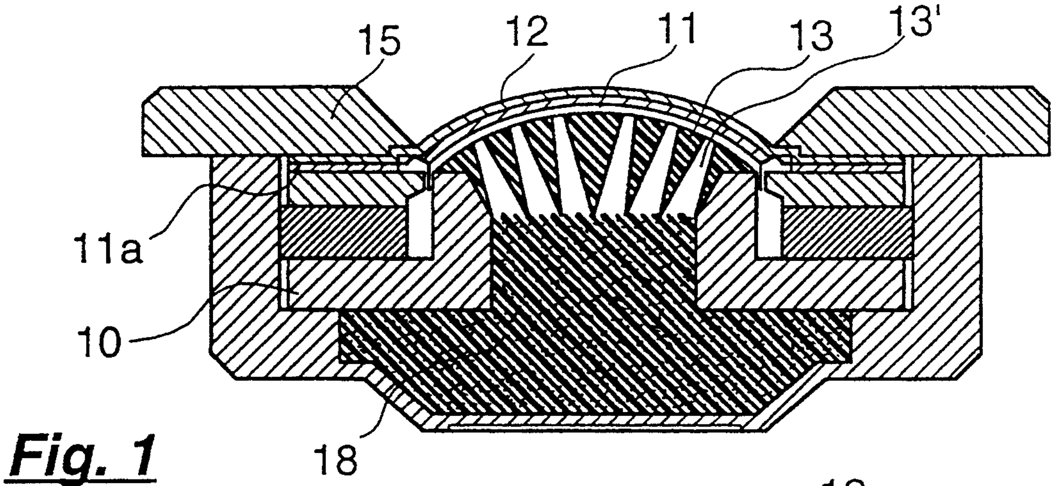
FIG. 1 shows, in cross-sectional view, the transducer in its direct-radiation configuration.

The electrodynamic electroacoustical transducer under investigation comprises a compound body, which is known in itself and is indicated globally as 10, a diaphragm 11 which is placed on the body by means of a washer 11*a*, in combination with the body and the diaphragm, three specific components: a nonmagnetic disk 12, a power-factor-improvement device/super charger 13 and a likewise non-magnetic cover 14, and two flanges which can be used alternately: a flange 15 for setting up the direct-radiation transducer and a flange 16 for setting up the indirect-radiation transducer.

Figure 3A:
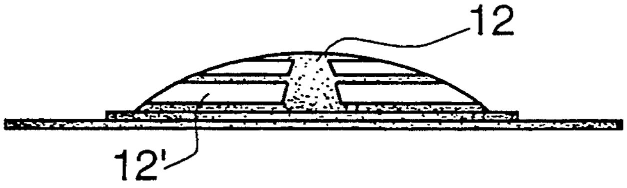
FIG. 3*a* shows a side view of the nonmagnetic disk.
Figure 3:
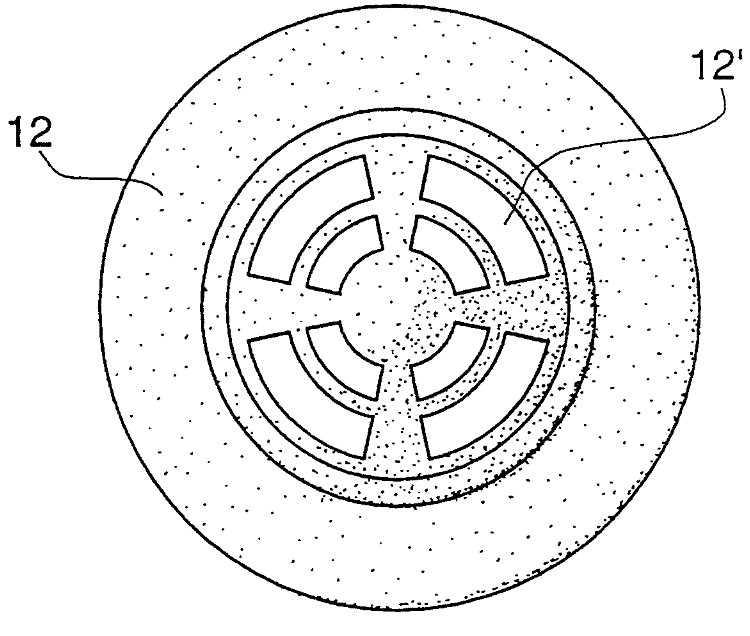
FIG. 3 shows a plan view of the nonmagnetic disk.
Figure 4:
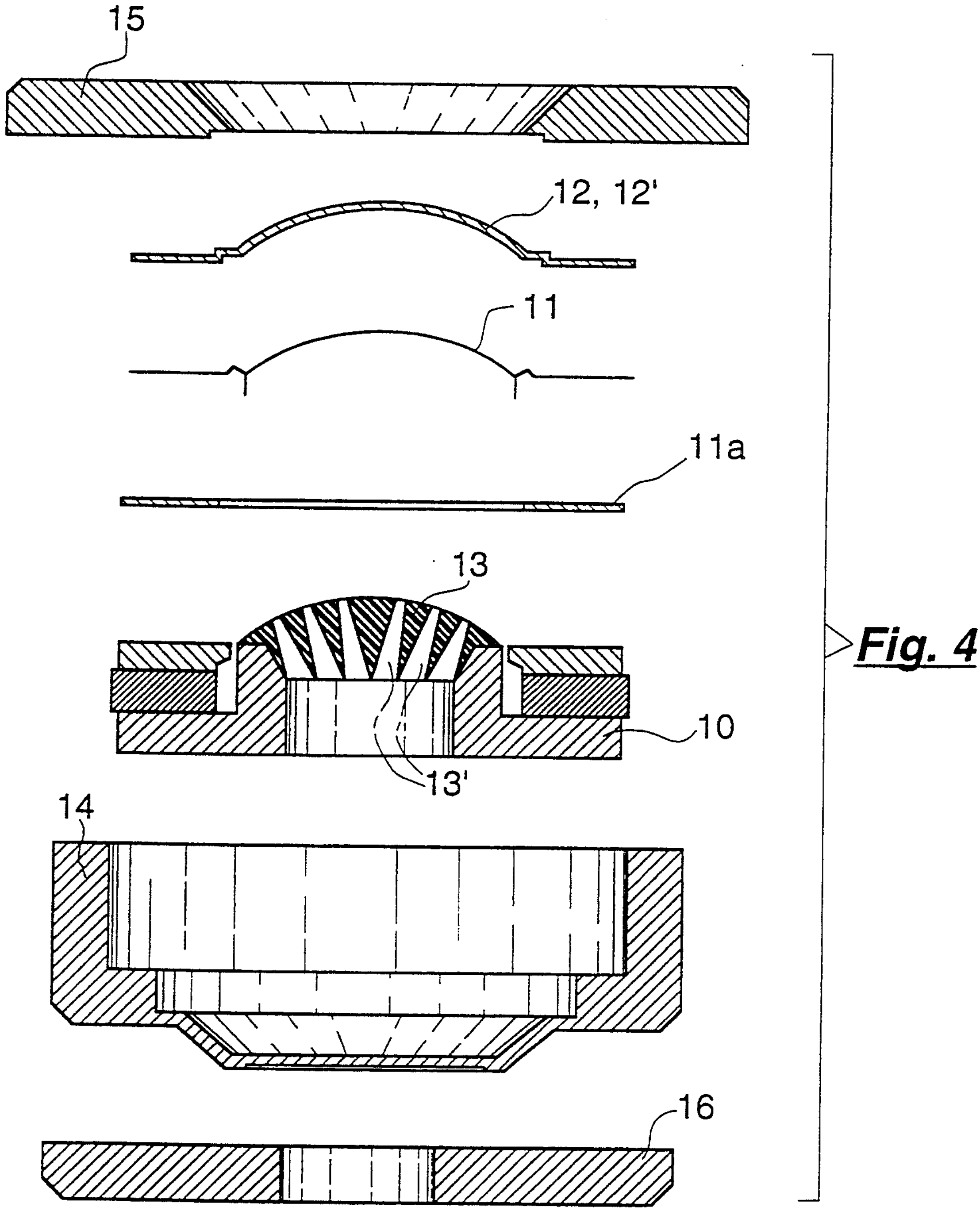
FIG. 4 shows, in cross section and separated, the components for the embodiment of the transducer according to the present invention.

The nonmagnetic disk 12 is made of an inflexible, even nonmetallic material, with variable thickness. In addition, the disk (See—FIGS. 3 and 3*a* with—) is shaped according to the curvature of the said diaphragm 11 and has the openings 12', from which sound can be output in a more or less accelerated manner, for the purpose of obtaining a reproduction of the entire sound spectrum without, to the extent possible, destructive interferences due to phase erasures.

The disk 12, which forces the sound waves to a given distance, has, as is known, the function of a power-factor-improvement device/super charger. Moreover, disk is designed with a savings in costs by means of reducing the number of pieces which-usually compose a similar transducer so as to perform more essential functions.

In the embodiment of a direct-radiation transducer as in FIG. 1, in addition to the power-factor-improvement device/super charger 13, the disk 12 also has the function of supporting and securely anchoring the diaphragm 11 and of mechanically protecting the diaphragm against possible impacts.

Figure 2:
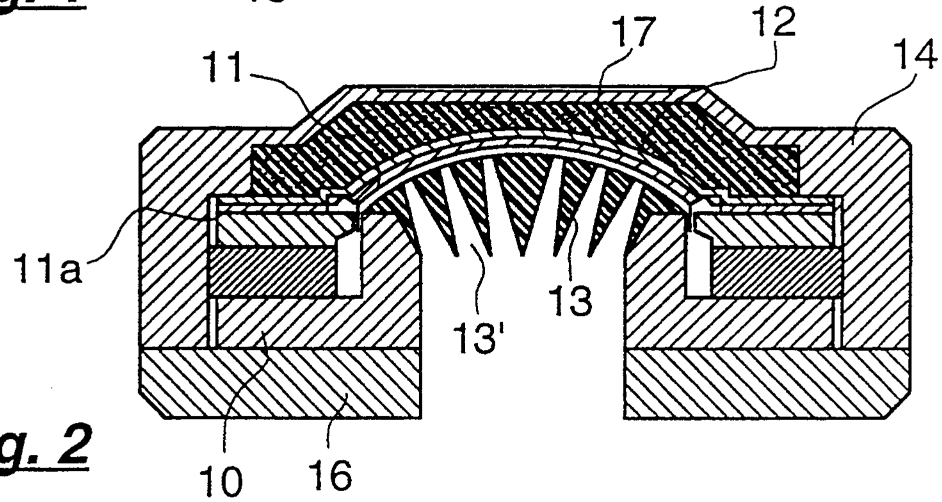
FIG. 2 shows, in cross-sectional view, the transducer in its indirect-radiation configuration.

In the case then of an indirect-radiation transducer (compression driver), as shown in FIG. 2, in addition to the above-mentioned functions, the nonmagnetic disk 12 also has the function of controlling the sound-absorbing material 17 (See FIG. 2—) arranged in the chamber behind the diaphragm for the purpose of avoiding destructive stationary waves which could impair the acoustical performances of the device.

The suitably called power-factor-improvement device/super charger 13 is arranged in the concavity defined by the said diaphragm 11, between the diaphragm and the body 10. The super charger has annular concentric ducts 13' with a conical shape, and it is made of a nonmagnetic, even nonmetallic material. Such a component 13 is used with compression (compression driver) for connecting the diaphragm, without destructive phase erasures, with the stem of the horn which component must guide in the configuration of the indirect-radiation transducer.

However, in addition to this generalized use in compression drivers, the power-factor-improvement device 13 also provides a second, very useful and suitable use in the case of the direct-radiation transducer. In this case, the power-factor-improvement device/super charger 13 is arranged behind the diaphragm and serves as an adjustable damper of the diaphragm and thus makes it possible to linearize the response in the frequency of the said transducer for damping resonances. The system (See FIG. 1—) can be adjusted with the introduction of an absorbent material 18 with greater or lesser density or quantity in one or more of the annular, concentric ducts 13′ which connect the small cavity arranged under the diaphragm with the chamber behind the diaphragm.

The nonmagnetic cover 14 can be made of a likewise non-metallic material. The cover is formed by a component which, in both types of transducers, serves as a lid which seals the chamber behind the diaphragm to obtain the appropriate acoustical load.

Essentially, the originality of the present invention consists in having designed a transducer for medium and high frequencies, which is adapted, with the simple adjustment of a cover by the last user and the use of the said flange 15 or 16, to any type of use currently required within the scope of musical reproduction. Thus, the transducer may be used on apparatus either for domestic use (direct-radiation transducer with wide angle of dispersion, excellent linearity and medium/high output thanks to the twofold system of power-factor-improvement device/super charger 13 and damping material, dynamic capacitance suitable for today's digital power sources) or for professional use (indirect-radiation transducer, compression drivers, with connection to the air by means of a horn controlling the dispersion, excellent linearity and the highest output thanks to the twofold system of power-factor-improvement device/super charger 13 and damping material).

In addition to its versatility, the behavior of the transducer, particularly by the use of the said mechanics used to obtain it, is consistently modified, with resulting improvement in the physical and acoustical performances, in the manner of an improved linearity and of a control of the distortion by means of an appropriately metered and differentiated damping.

What is claimed is:

1. Moving-coil electrodynamic acoustical transducer for medium and high frequencies, usable for either direct radiation of sound or for an indirect radiation of sound via connection to a horn, the transducer comprising:

a compound body;

a diaphragm connected to said compound body, said diaphragm having a convex part with an outer convex side and an inner concave side;

a washer interposed between said diaphragm and said compound body;

a disk formed of non-magnetic hard material, said disk being superimposed on said diaphragm and adopting a shape of said diaphragm, aid disk having openings for the output of sound and defining direct-radiation transducer power-factor-improvement device/super charger means for direct-radiation configuration of said transducer;

indirect radiation power-factor-improvement device/super charger means formed of non-magnetic material arranged in a concavity on said concave side of said diaphragm between said diaphragm and said compound body, said indirect means having annular concentric ducts with a conical shape, aid indirect radiation power-factor-improvement device/super charger means for forcing sound waves to a given distance in a indirect radiation configuration of said transducer and for forming an adjustable damper of said diaphragm in a direct-radiation configuration of said transducer;

a cover formed of non-magnetic material serving as a lid of said transducer in each of said direct radiation configuration an said indirect radiation configuration, said cover being applied to said body facing said concave side of said diaphragm in said direct-radiation configuration and said cover being applied to said body facing said convex side in an indirect radiation configuration; and a flange connected about said non-magnetic disk in said direct-radiation configuration and connected to said compound body at a side of said compound body opposite said non-magnetic disk in said indirect-radiation configuration.

2. An electrodynamic electroacoustical transducer according to claim 1, wherein said diaphragm is supported and securely anchored to said non-magnetic disk.

3. Electrodynamic electroacoustical transducer according to claim 1, wherein sound absorbing material is arranged between said power-factor-improvement device/super charger means and said cover lid in said direct-radiation configuration, said sound absorbing material insertable in a diversified manner in said concentric ducts of said power-factor-improvement device/super charger means.

4. Electrodynamic electroacoustical transducer according to claim 1, wherein sound absorbing material is arranged between said non-magnetic hard disk and said cover lid in said indirect-radiation configuration.

5. Moving-coil electrodynamic acoustical transducer for medium and high frequencies, usable for either direct radiation of sound or for an indirect radiation of sound via connection to a horn, the transducer comprising:

a compound body;

a diaphragm connected to said compound body, said diaphragm having a convex part with an outer convex side and an inner concave side;

a washer interposed between said diaphragm and said compound body;

a disk formed of non-magnetic hard material, said disk being superimposed on said diaphragm and adopting a shape of said diaphragm, aid disk having openings for the output of sound and defining direct-radiation transducer power-factor-improvement device/super charger means for direct-radiation configuration of said transducer;

indirect radiation power-factor-improvement device/super charger means formed of non-magnetic material arranged in a concavity on said concave side of said diaphragm between said diaphragm and said compound body, said indirect means having annular concentric ducts with a conical shape, aid indirect radiation power-factor-improvement device/super charger means for forcing sound waves to a given distance in a indirect radiation configuration of said transducer and for forming an adjustable damper of said diaphragm in a direct-radiation configuration of said transducer;

a cover formed of non-magnetic material serving as a lid of said transducer in each of said direct radiation configuration an said indirect radiation configuration, said cover being applied to said body facing said concave side of said diaphragm in said direct-radiation configuration and said cover being applied to said body facing said convex side in an indirect radiation configuration; and a flange connected about said non-magnetic disk in said direct-radiation configuration and another flange connected to said compound body at the side of said compound body opposite said non-magnetic disk in said indirect-radiation configuration, wherein said diaphragm, said disc formed of non-magnetic hard material and said indirection power factor improvement device/supercharger means form a diaphragm assembly with a concave side and a convex side, said cover having an open end and a closed end, wherein said closed end is exposed covering said convex side in said indirect radiation configuration and said cover closed end is disposed covering said concave side in said direct radiation configuration.

6. Moving-coil electrodynamic acoustical transducer for medium and high frequencies, usable for either direct radiation of sound or for an indirect radiation of sound via connection to a horn, the transducer comprising:

a compound body;

a diaphragm connected to said compound body, said diaphragm having a convex part with an outer convex side and an inner concave side;

a washer interposed between said diaphragm and said compound body;

a disk formed of non-magnetic hard material, said disk being superimposed on said diaphragm and adopting a shape of said diaphragm, aid disk having openings for the output of sound and defining direct-radiation transducer power-factor-improvement device/super charger means for direct-radiation configuration of said transducer;

indirect radiation power-factor-improvement device/super charger means formed of non-magnetic material arranged in a concavity on said concave side of said diaphragm between said diaphragm and said compound body, said indirect means having annular concentric ducts with a conical shape, aid indirect radiation power-factor-improvement device/super charger means for forcing sound waves to a given distance in a indirect radiation configuration of said transducer and for forming an adjustable damper of said diaphragm in a direct-radiation configuration of said transducer;

a cover formed of non-magnetic material serving as a lid of said transducer in each of said direct radiation configuration an said indirect radiation configuration, said cover being applied to said body facing said concave side of said diaphragm in said direct-radiation configuration and said cover being applied to said body facing said convex side in an indirect radiation configuration; and a flange connected about said non-magnetic disk in said direct-radiation configuration and another flange connected to said compound body at the side of said compound body opposite said non-magnetic disk in said indirect-radiation configuration, wherein said diaphragm, said disc formed of non-magnetic hard material and said indirection power factor improvement device/supercharger means form a diaphragm assembly with a concave side and a convex side, said cover having an open end and a closed end, wherein said closed end is exposed covering said convex side with sound dampening material disposed between said convex side and said cover closed end in said indirect radiation configuration and said cover closed end is disposed covering said concave side, with sound absorbent material disposed between said concave side and said cover closed end in said direct radiation configuration.

* * * * *

UNITED STATES PATENT AND TRADEMARK OFFICE

CERTIFICATE OF CORRECTION

PATENT NO. : 5,351,220

DATED : September 27, 1994

INVENTOR(S) : NOSELLI

It is certified that error appears in the above-indentified patent and that said Letters Patent is hereby corrected as shown below:

On the title page, item

[73] Assignee: Outline S.N.C. Di Noselli G. & C.
Flero, Italy

Signed and Sealed this

First Day of May, 2001

Attest:

Nicholas P. Godici

NICHOLAS P. GODICI

*Attesting Officer* — *Acting Director of the United States Patent and Trademark Office*